United States Patent
Matsumoto et al.

(10) Patent No.: US 10,354,048 B2
(45) Date of Patent: Jul. 16, 2019

(54) CONTROL PROGRAM, CONTROL METHOD, AND CONTROL DEVICE FOR DRIVING A MECHANICAL TESTING DEVICE

(71) Applicant: KOKUSAI KEISOKUKI KABUSHIKI KAISHA, Tokyo (JP)

(72) Inventors: Sigeru Matsumoto, Tokyo (JP); Hiroshi Miyashita, Tokyo (JP); Kazuyoshi Tashiro, Kanagawa (JP); Kazuhiro Murauchi, Tokyo (JP)

(73) Assignee: KOKUSAI KEISOKUKI KABUSHIKI KAISHA, Tokyo (JP)

( * ) Notice: Subject to any disclaimer, the term of this patent is extended or adjusted under 35 U.S.C. 154(b) by 1062 days.

(21) Appl. No.: 14/274,879

(22) Filed: Jun. 2, 2014

(65) Prior Publication Data

US 2014/0257781 A1     Sep. 11, 2014

Related U.S. Application Data

(63) Continuation-in-part of application No. PCT/JP2012/077960, filed on Oct. 30, 2012.

(30) Foreign Application Priority Data

Nov. 12, 2011   (JP) .................................. 2011-248124

(51) Int. Cl.
*G06G 7/48* (2006.01)
*G06F 17/50* (2006.01)
(Continued)

(52) U.S. Cl.
CPC ......... *G06F 17/5086* (2013.01); *G01M 7/022* (2013.01); *G01M 7/025* (2013.01);
(Continued)

(58) Field of Classification Search
None
See application file for complete search history.

(56) References Cited

U.S. PATENT DOCUMENTS

| | | | |
|---|---|---|---|
| 5,355,062 A | 10/1994 | Takizawa et al. | |
| 5,446,360 A | 8/1995 | Son et al. | |

(Continued)

FOREIGN PATENT DOCUMENTS

| | | |
|---|---|---|
| CN | 1093507 | 10/1994 |
| CN | 1466811 | 1/2004 |

(Continued)

OTHER PUBLICATIONS

Mitsubishi Integrated FA Software Melsoft, Mitsubishi Electric, pp. 25-26, May 2005.

(Continued)

*Primary Examiner* — Aniss Chad
*Assistant Examiner* — Nithya J. Moll
(74) *Attorney, Agent, or Firm* — McCarter & English, LLP (57) ABSTRACT

A control device including a simulation unit to simulate behaviors of a virtual mechanical system, and a drive control unit to control driving of servomotors based on the simulation results, is provided. The virtual mechanical system includes a first drive module, a first main shaft module connected to the first drive module, and a plurality of power transmission subsystems, each of which is connected to the first main shaft module and is associated with one of the servomotors respectively. Each of the power transmission subsystems includes an output module. The servomotor associated with the power transmission subsystem is driven according to a simulated result of input into the output module.

8 Claims, 11 Drawing Sheets

(51) Int. Cl.
 *G05B 17/02* (2006.01)
 *G01M 7/02* (2006.01)
 *G05B 19/414* (2006.01)
 *G01M 13/025* (2019.01)

(52) U.S. Cl.
 CPC .......... *G01M 13/025* (2013.01); *G05B 17/02* (2013.01); *G05B 19/414* (2013.01); *G05B 2219/42163* (2013.01); *G05B 2219/50218* (2013.01); *G05B 2219/50229* (2013.01)

(56) References Cited

U.S. PATENT DOCUMENTS

| | | | |
|---|---|---|---|
| 5,565,748 A | 10/1996 | Takizawa et al. | |
| 6,286,104 B1* | 9/2001 | Buhle | H04L 63/105 707/999.009 |
| 6,366,045 B1* | 4/2002 | Fahrbach | G05B 19/182 318/560 |
| 6,873,132 B2 | 3/2005 | Kaku et al. | |
| 6,914,404 B2 | 7/2005 | Kaku et al. | |
| 8,007,401 B2 | 8/2011 | Saito et al. | |
| 8,108,191 B1* | 1/2012 | Britch | G01M 13/02 318/139 |
| 9,568,904 B2* | 2/2017 | Suematsu | G05B 19/0426 |
| 2003/0055582 A1 | 3/2003 | Horiuchi et al. | |
| 2003/0169004 A1 | 9/2003 | Kaku et al. | |
| 2004/0090198 A1 | 5/2004 | Kaku et al. | |
| 2004/0122536 A1* | 6/2004 | Saitou | F15B 9/09 700/70 |
| 2008/0293538 A1 | 11/2008 | Saito et al. | |
| 2013/0097292 A1* | 4/2013 | Yoakum | H04M 3/42 709/221 |

FOREIGN PATENT DOCUMENTS

| | | |
|---|---|---|
| CN | 1529932 | 9/2004 |
| CN | 2831199 | 10/2006 |
| CN | 101301888 | 11/2008 |
| JP | 05-157656 | 6/1993 |
| JP | HEI 5-231981 | 9/1993 |
| JP | HEI 10-127100 | 5/1998 |
| JP | 2002-228541 | 8/2002 |
| JP | 2003-83840 | 3/2003 |
| JP | 2005085177 | 3/2005 |
| JP | 2009-77541 | 4/2009 |
| JP | 2010-159969 | 7/2010 |
| JP | 2011-176950 | 9/2011 |
| KR | 10-1991-0016130 A | 9/1991 |
| WO | 2008120304 | 10/2008 |

OTHER PUBLICATIONS

International Search Report of PCT/JP2012/077960.
International Preliminary Report on Patentability issued in Application No. PCT/JP2012/077960 dated Jun. 12, 2014.
Notice of Allowance issued in Japanese Application No. JP 2013-542934 dated May 7, 2015.
Office Action issued in Taiwan Application No. 101141175 dated May 10, 2016.
Office Action issued in Chinese Application No. 201280061313.7 dated Jul. 14, 2016.
Office Action issued in Chinese Application No. 201280061313.7 dated Jan. 26, 2017.
European Search Report issued in Application No. 12848170.2 dated Nov. 20, 2015.
Office Action issued in Chinese Application No. 201280061313.7 dated Nov. 23, 2015.
Communication pursuant to Article 94(3) EPC issued in European Application No. 12848170.2 dated Jul. 25, 2017 (7 pages).
Notification of Reexamination issued in Application No. 201280061313.7 dated Aug. 29, 2017 along with English translation.
Office Action (Decision of Re-examination) issued in Chinese Application No. 201280061313.7 dated Jan. 8, 2018.
Office Action (Notice of Grounds for Preliminary Rejection) dated Jan. 21, 2019, in connection with Korean Application No. 10-2014-7015851, along with English translation thereof (15 pages).

* cited by examiner

CONTROL PROGRAM, CONTROL METHOD, AND CONTROL DEVICE FOR DRIVING A MECHANICAL TESTING DEVICE

This is a Continuation-in-Part of International Application No. PCT/JP2012/077960 filed on Oct. 30, 2012, which claims priority from Japanese Patent Application No. 2011-248124 filed on Nov. 12, 2011. The entire disclosure of the prior applications is hereby incorporated by reference herein its entirety.

TECHNICAL FIELD

The present invention relates a control program, a control method, and a control device to control driving of servomotor-typed mechanical testing device driven by, for example, a servomotor.

BACKGROUND

Along with practical application of a lower-inertial high-power AC servomotor (hereinafter, abbreviated as "servomotor") capable of outputting fluctuating torque in high frequency over 100 Hz, a servomotor-typed mechanical testing device (e.g., a fatigue testing device and a vibration testing device) using a servomotor as a driving source in place of a conventional hydraulic actuator has been commonly accepted. While the servomotor is relatively small and is easier to be handled and maintained compared to a hydraulic device, demands for the mechanical testing device, which enables advanced tests using a plurality of servomotors, have been increased. In the meantime, the servomotor may contain problems such that controlling synchronously the plurality of servomotors, of which output fluctuates in high speed, requires advanced controlling techniques, and a large amount of development costs and a long term of developing time are required to develop dedicated controlling programs.

Developer's environments to effectively build a controlling system to synchronously control a plurality of servomotors are provided by manufacturers of servomotors (non-patent document 1: Mitsubishi Integrated FA Software MELSOFT, effective May 2005, pages 25-26. [online] MITSUBISHI ELECTRIC. [retrieved on Nov. 2, 2011]. Retrieved from the Internet). Non-patent 1 discloses a visual programming language called mechanical system program. The mechanical system program simulates hardware-based synchronous control to mechanically control driving of a plurality of output shafts synchronously by use of mechanical elements, such as gears and cams, on software basis and synchronously control the plurality of servomotors associated with output shafts (virtual shafts) on the software basis.

SUMMARY

However, even with the benefit of the developer's environment described in the non-patent document 1, according to conventional and common programming methods, in order to achieve advanced control required for mechanical testing devices in recent years, architectures in the program tend to be complicated; therefore, a program architecture which can be developed efficiently has been demanded.

According to an embodiment of the present invention, a control program to manipulate a computer to simulate behaviors of a virtual mechanical system being a virtual mechanism and to control synchronized driving of a plurality of servomotors based on results of the simulation is provided. The virtual mechanical system includes a first drive module; a first main shaft module connected to the first drive module; and a plurality of power transmission subsystems, each of which is connected to the first main shaft module and is associated with one of the plurality of servomotors respectively, wherein each of the power transmission subsystems includes an output module, and wherein the servomotor associated with the power transmission subsystem is driven according to a simulated result of input into the output module.

According to this configuration, with use of the virtual mechanical module, complex drive control of the servomotors can be easily performed.

Optionally, each of the power transmission subsystems may further comprise: a second drive module; and a differential gear module comprising a main input shaft, an auxiliary input shaft, and an output shaft. The main input shaft may be connected with the first main shaft module, the auxiliary input shaft may be connected with the second drive module, and the output shaft may be connected with the output module.

According to this configuration, with use of the virtual mechanical module, composition of outputs of the first drive module and the second drive module by the differential gear module is virtually achieved so that complex drive control of the servomotors can be easily performed.

Optionally, the main input shaft may be connected with the first main shaft module via a first clutch module.

According to this configuration, with switching ON/OFF of the first clutch module, driving ON/OFF of each servomotor by the first driving module can be easily controlled.

Optionally, the auxiliary input shaft may be connected with the second drive module via a second clutch module.

According to this configuration, while input from the second drive module to the differential gear module is ON/OFF controllable by the second clutch module, output from each servomotor can be individually and easily controlled.

Optionally, a phase of driving the servomotor may be controlled by setting a rotational position of the second drive module.

According to this configuration, output from the second drive module for the phase control can be provided to a desired servomotor by the second clutch module; therefore, a phase of each servomotor can be independently set, and the servomotor drive control program which can be easily developed or modified is provided.

Optionally, by driving the first drive module according to a first driving waveform and by driving the second drive module according to an oscillatory waveform, rotation of the servomotor may be oscillated according to the oscillatory waveform centering around a rotational position of the servomotor defined by the first driving waveform.

Optionally, the first driving waveform may be a ramp wave, and a center of rotary oscillation of the servomotor may move at a constant-angled velocity.

Optionally, a driving waveform of the servomotor may be offset by driving the second drive module in a stepwise pattern according to a rectangular wave.

According to an embodiment of the present invention, a control method to manipulate a computer to simulate behaviors of a virtual mechanical system being a virtual mechanism and to control synchronized driving of a plurality of servomotors based on results of the simulation is provided. The virtual mechanical system includes a first drive module; a first main shaft module connected to the first drive module; and a plurality of power transmission subsystems, each of which is connected to the first main shaft module and is associated with one of the plurality of servomotors respectively, wherein each of the power transmission subsystems includes an output module, and wherein the servomotor associated with the power transmission subsystem is driven according to a simulated result of input into the output module.

Optionally, each of the power transmission subsystems may further comprise: a second drive module; and a differential gear module comprising a main input shaft, an auxiliary input shaft, and an output shaft. In this case, the main input shaft may be connected with the first main shaft module, the auxiliary input shaft may be connected with the second drive module, and the output shaft may be connected with the output module.

According to an embodiment of the present invention, a control device to simulate behaviors of a virtual mechanical system being a virtual mechanism and control synchronized driving of a plurality of servomotors based on results of the simulation is provided. The control device includes a simulation unit configured to simulate the behaviors of the virtual mechanical system; and a drive control unit configured to control driving of the plurality of servomotors based on the results of the simulation, wherein the virtual mechanical system includes a first drive module; a first main shaft module connected to the first drive module; and a plurality of power transmission subsystems, each of which is connected to the first main shaft module and is associated with one of the plurality of servomotors respectively, wherein each of the power transmission subsystems includes an output module, wherein the drive control unit outputs a control signal to control driving of the servomotor associated with the power transmission subsystem according to a simulated result of input into the output module.

Optionally, each of the power transmission subsystems may further comprise: a second drive module; and a differential gear module comprising a main input shaft, an auxiliary input shaft, and an output shaft. In this case, the main input shaft may be connected with the first main shaft module, the auxiliary input shaft may be connected with the second drive module via a first clutch module, and the output shaft may be connected with the output module.

DETAILED DESCRIPTION OF EMBODIMENTS

Hereafter, embodiments of the invention is described with reference to the accompanying drawings.

Figure 1:
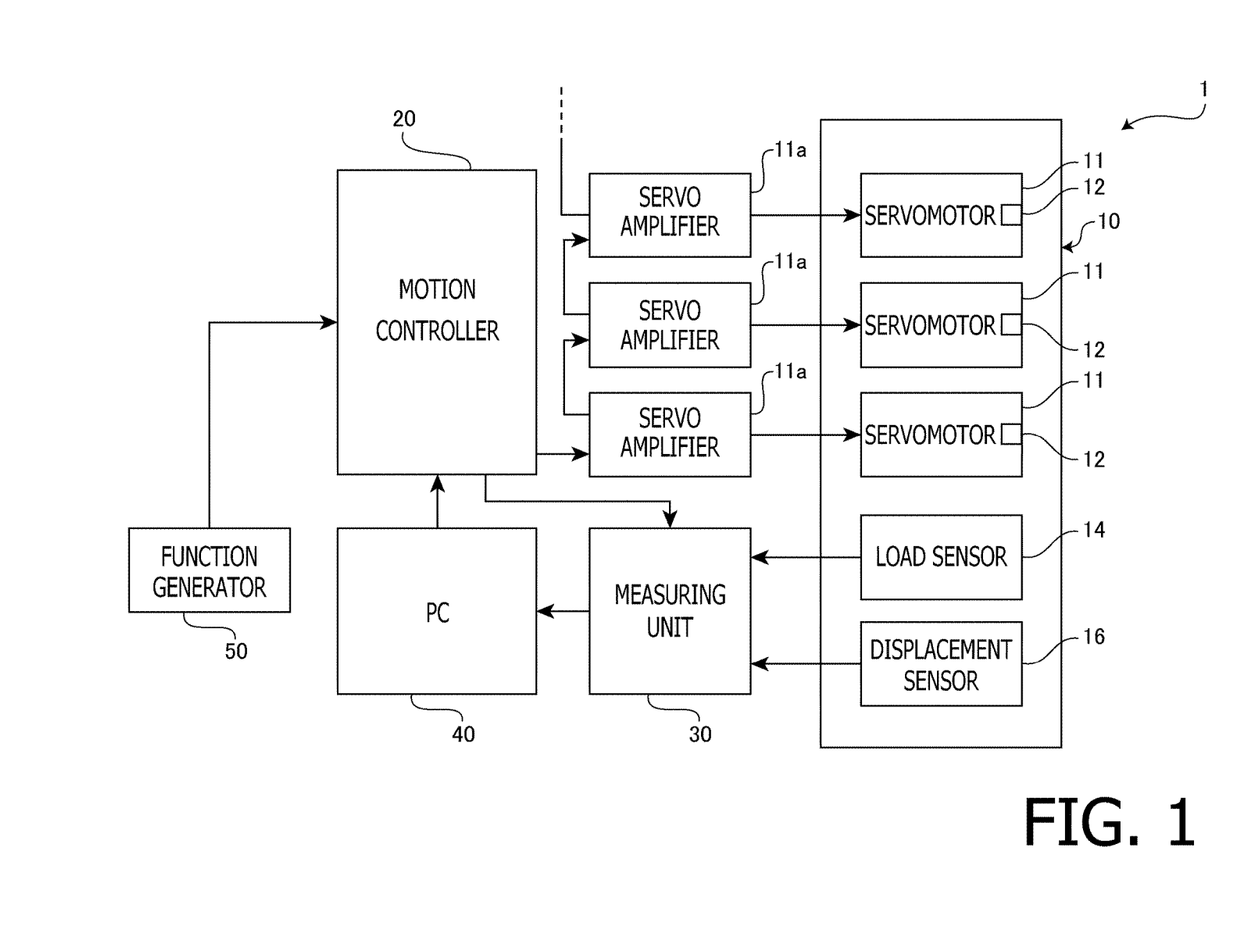
FIG. 1 is a block diagram to illustrate an overall hardware configuration of a mechanical testing device according to an embodiment of the present invention.

FIG. 1 is a block diagram to illustrate an overall hardware configuration of a mechanical testing device 1 according to an embodiment of the present invention. The mechanical testing device 1 includes a testing mechanism 10 having plurality of servomotors 11; a plurality of servo amplifiers 11a, each of which is associated with one of the plurality of servomotors 11; a motion controller 20, a measuring unit 30, a PC (personal computer) 40, and a function generator 50.

The testing mechanism 10 is equipped with a load sensor 14 for detecting load applied to a specimen (not shown) and a displacement sensor 16 for detecting displacement of the specimen. In place of the displacement sensor 16, the testing mechanism 10 may be equipped with another type of sensor to detect responses from the specimen (e.g., torsion gauge sensor, speed sensor, acceleration sensor, etc.). Each of the servomotors 11 is equipped with a rotary encoder 12 for detecting a rotating amount of a rotation axis.

Each of the servo amplifiers 11a is connected to one of the servomotors 11 respectively and supplies driving current to the connected corresponding servomotor 11 based on instructing signals from the motion controller 20. The servo amplifiers 11a are in daisy-chain connection with the motion controller 20 by optical fiber cables.

The motion controller 20 generates driving control signals to control driving of the servomotors 11 based on various setting parameters (described later), which are input from the PC 40, and outputs the generated signals to the servo amplifier 11a. The motion controller 20 is configured also to be capable of generating driving control signals based on alternating current voltage signals generated by the function generator 50. A configuration of the motion controller 20 will be described later in detail.

The measuring unit 30 converts detection signals from the load sensor 14 and the displacement sensor 16 into digital data and outputs the digital data to the PC 40. The measuring unit 30 is connected to the motion controller 20. Digital signals indicating the rotation amounts of the servomotors 11, which are detected by the rotary encoders 12, are input into the measuring unit 30 through the servo amplifiers 11a and the motion controller 20, and are transmitted to the PC 40 along with the detected results from the load sensor 14 and the displacement sensor 16.

The PC 40 computes target waveform data for driving the servomotors 11 based on input from a user, generates various setting parameters to define the target waveform data, and outputs the setting parameters to the motion controller 20. The PC 40 also computes test results based on various kinds of measured data output from the measuring unit 30 in real time, displays the test results, and records the test results in an internal memory (not shown). Further, the PC 40 is equipped with a function to modify the target waveform data based on the various types of measured data from the measuring unit 30. These procedures are conducted by using dedicated application software, which is installed in the PC 40.

Figure 2:
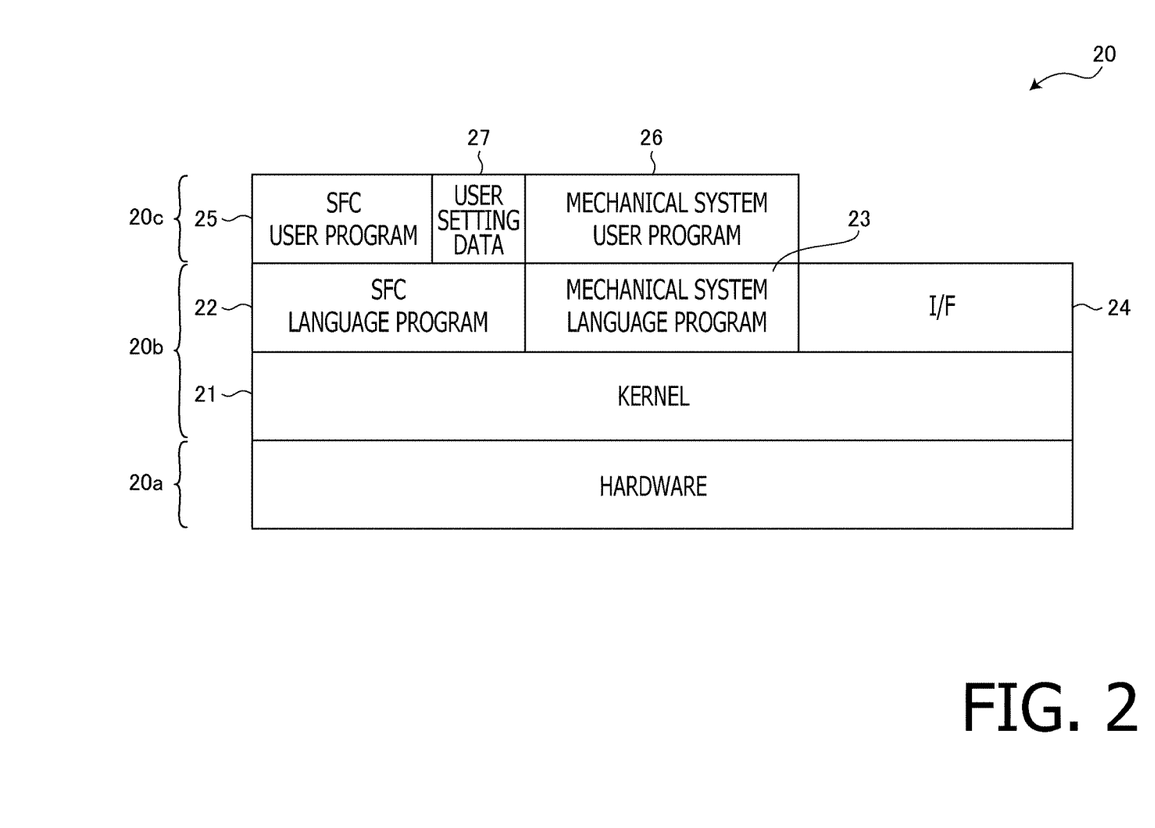
FIG. 2 is a block diagram to illustrate an overall configuration of a motion controller.

FIG. 2 is a block diagram to illustrate an overall configuration of the motion controller 20. The motion controller 20 is configured with hardware 20a, an operation system 20b, and a user program 20c. The operation system 20b is in a hierarchic structure and includes a kernel 21 to directly administrate the hardware 20a in a lower layer, a motion-controlling SFC language program 22 (hereinafter, "SFC language program 22") working on the kernel 21 in an upper layer, a mechanical system language program 23, and an interface 24. The SFC language program 22 interprets and executes the user program 20c (SFC user program 25), which is described in a motion-controlling SFC language developed for motion control. The motion-controlling SFC language is a visual programming language to describe procedures of motion control in a flowchart format. Meanwhile, the mechanical system language program 23 interprets and executes the user program 20c (mechanical system user program 26) described in a mechanical system language. The mechanical system user program 26 is used to describe control of synchronous driving of the plurality of servomotors 11 and is called by the SFC language program 22 to be executed. The user program 20c includes, in addition to the above-described SFC user program 25 and the mechanical system user program 26, configuration data such as basic waveform data 27 which is to be used to execute the SFC user program 25. Meanwhile, the interface 24 administrates input/output between the external devices (e.g., the PC 40 connected to the motion controller 20 and the function generator 50).

Embodiment 1

Figure 3:
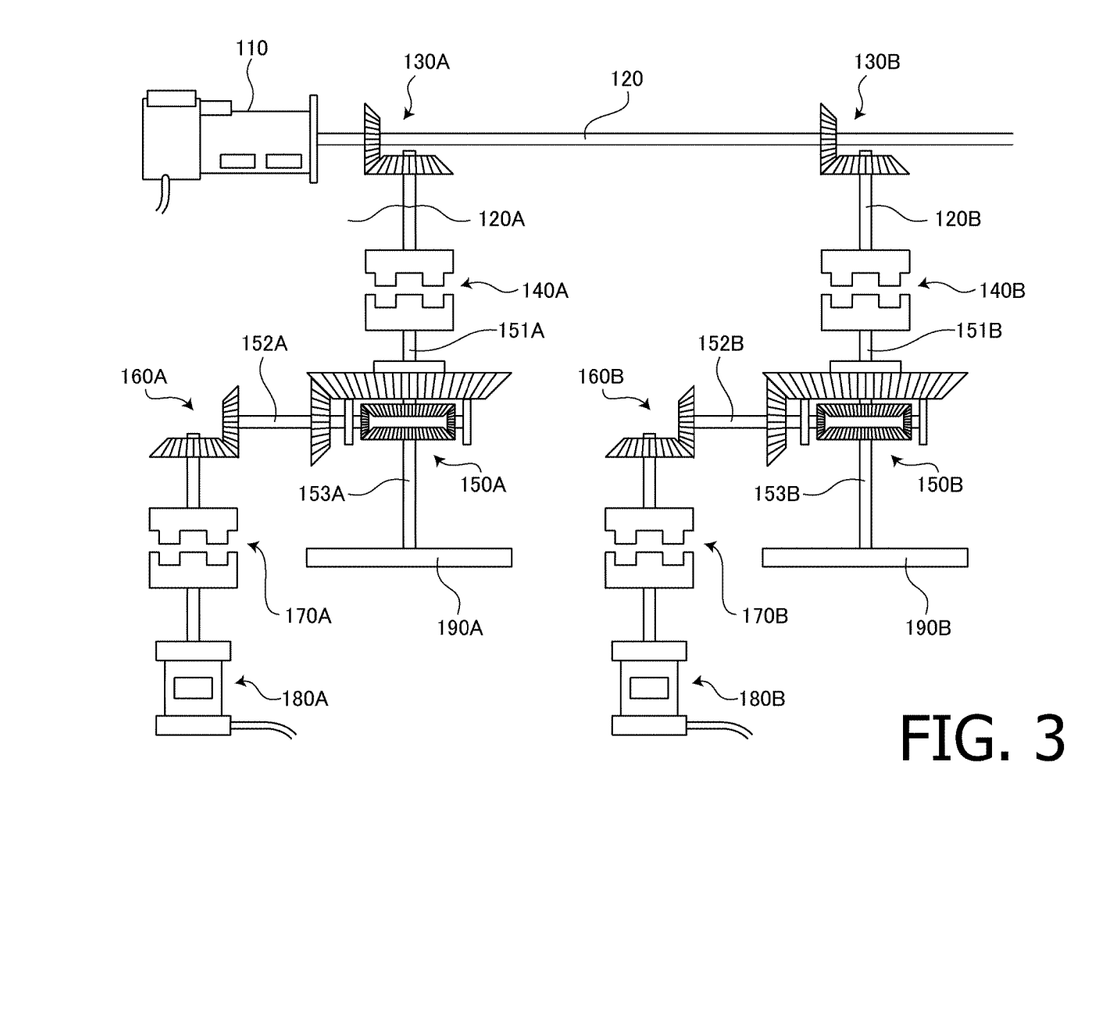
FIG. 3 is a diagram to illustrate a mechanical system user program to be executed in Embodiment 1.

Next, an example of exemplary control by use of a mechanical testing device 1 will be described. FIG. 3 shows a diagram to illustrate the mechanical system user program 26 to be executed in Embodiments 1-3 described below. Embodiment 1 is an example of control to synchronously rotate the servomotors 11 at a predetermined phase difference. The mechanical system user program 26 includes a first drive module 110 and a first main shaft 120 driven by the first drive module 110. The first main shaft 120 is provided with a plurality of gears, of which quantity is equal to the quantity of the servomotors 11 which are to be actually driven (in FIG. 3, only gears 130A, 130B for two routes are shown), and is connected to a plurality of second main shafts 120A, 120B via the gears 130A, 130B respectively. The second main shaft 120A is connected to a main input shaft 151A of a differential gear (differential gear device) 150A through a clutch 140A. Further, an auxiliary input shaft 152A of the differential gear 150A is connected to a second drive module 180A through a gear 160A and a clutch 170A. Meanwhile, an output module 190A is connected to an output shaft 153A of the differential gear 150A. The differential gear 150A transmits differential rotation between rotation of the main input shaft 151A and rotation of the auxiliary input shaft 152A to the output shaft 153A. To another second virtual main shaft (e.g., 120B, etc.) connected to the first main shaft 120, a virtual mechanism in a same structure (for example, a clutch 140B, a differential gear 150B, a gear 160B, a clutch 170B, a second drive module 180B, and an output module 190B) is connected. Each of the output modules (190A, 190B, etc.) is associated with one of the servomotors 11 on one-on-one basis, and each of the servomotors 11 is controlled to rotate in a same phase as the associated output module. According to the mechanical system described above, rotation of each servomotor 11 (output module) is associated with virtual rotation of the first drive module 110 (that is, driven synchronously). In Embodiment 1, a common driving pulse is input into each of the second drive modules (in FIG. 1, 180A and 180B), and the second drive modules are configured to rotate in a same phase for an angle corresponding to the driving pulse. In Embodiment 1, the first drive module 110 is configured to be rotatable in various waveforms (e.g., sine wave, triangular wave, rectangular wave, ramp wave, and discretional composite wave) according to commands being input.

Figure 4:
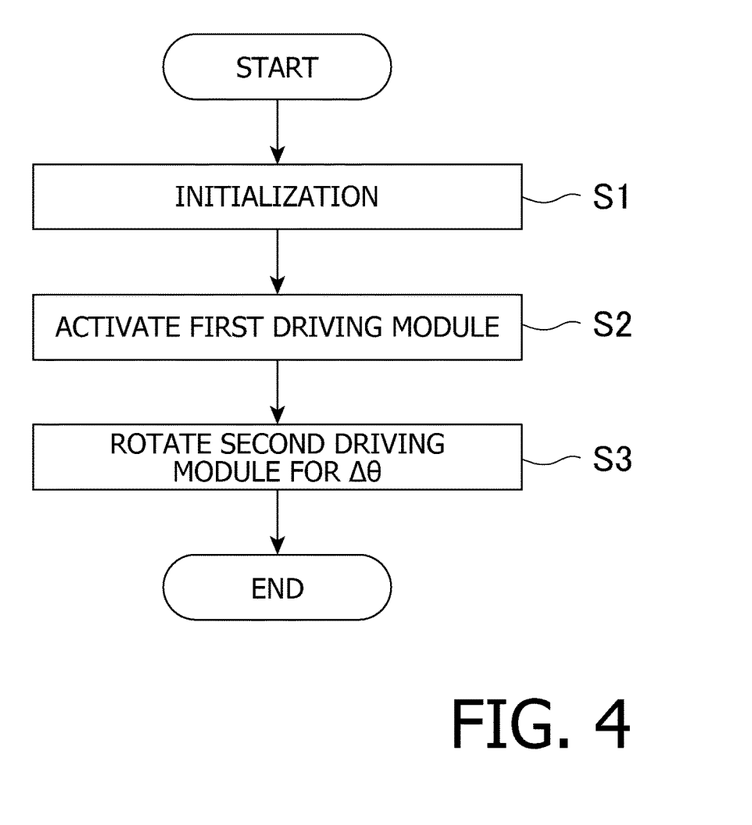
FIG. 4 is a flowchart to illustrate an operation flow in Embodiment 1.

Next, behaviors of the servomotors in Embodiment 1 will be described. As mentioned above, Embodiment 1 is an example to control the servomotors 11 to rotate in a predetermined phase difference and in a same waveform. Herein, an exemplary case to apply a phase difference between rotations of the servomotors 11 associated with the output modules 190A, 190B will be described. FIG. 4 is a flowchart to illustrate an operation flow in Embodiment 1.

First, in step S1, initialization is executed. In particular, the clutches 140A, 140B, and 170A are connected, and the clutch 170B is disconnected. Next, the first drive module 110 is activated (S2). In this regard, the output modules 190A and 190B are rotated in a same phase. Next, driving pulse corresponding to a predetermined rotation angle $\Delta\theta$ (e.g., 180 degrees) is input into the second drive modules 180A and 180B (S3). In this regard, with the clutch 170A being connected, the auxiliary input shaft 152A of the differential gear 150A is rotated for the rotation angle $\Delta\theta$ by the second drive module 180A, and the output shaft 153A of the differential gear 150 is given a phase difference (rotation angle difference) for $\Delta\theta$ with respect to the main input shaft 151A. Meanwhile, with the clutch 170B being disconnected, the auxiliary input shaft 152B of the differential gear 150B rotates at the same phase as the first drive module 110. While the main input shafts 151A, 151B of the differential gears 150A, 150B rotate at the same phase, the output shafts 153A, 153B of the differential gears 150A, 150B respectively rotate in a same waveform as the first drive module 110 at the phase difference $\Delta\theta$. In other words, according to the control of Embodiment 1, even when the rotational conditions of the first drive module 110 are changed, the servomotors 11 associated with the output modules 190A and 190B respectively can be maintained rotating at the same predetermined phase difference from each other. Further, according to the configuration in Embodiment 1, the driving waveform and phase of the servomotors 11 can be independently controlled. That is, while the driving waveform is controlled by use of the first drive module 110, the phase difference can be controlled by the second drive modules 180A, 180B and 170A, 170B independently from the control of the driving waveform.

Embodiment 2

Figure 5A:
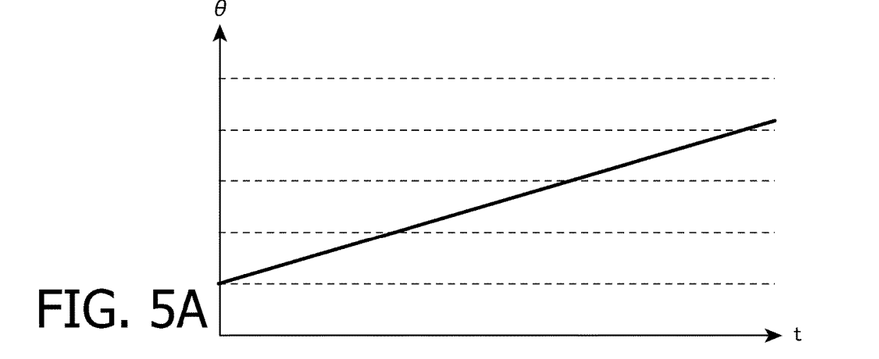
FIGS. 5A-5C are diagrams to illustrate driving of servomotors in Embodiment 2.
Figure 5B:
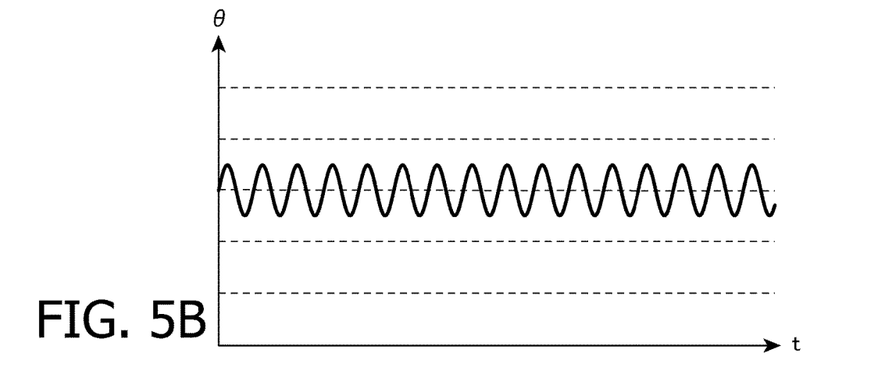
Figure 5C:
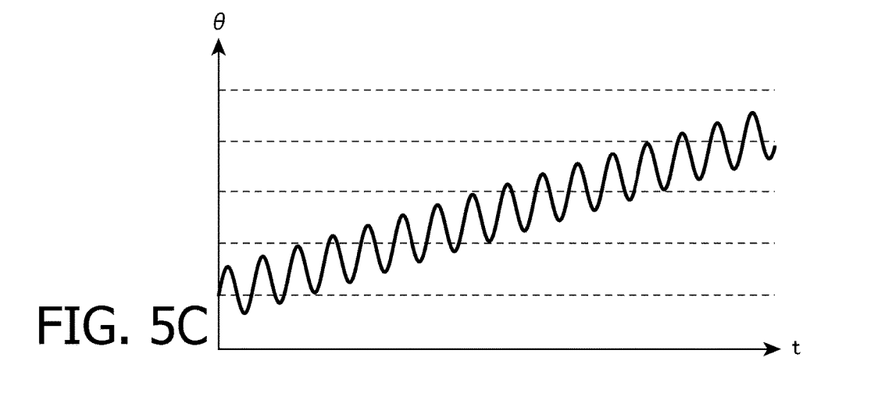

Next, Embodiment 2, in which rotation of the servomotors is controlled to be oscillated while being rotated at an average rate in a predetermined direction, is described. Herein, an example of control over the output module 190A will be described. FIGS. 5A-5C are diagrams to illustrate driving of the servomotors 11 according to Embodiment 2. In particular, FIGS. 5A, 5B, and 5C are graphs to illustrate chronological changes of rotation angles of the first drive module 110, the second drive module 180, and the output module 190A, respectively. In Embodiment 2, the clutches 140A, 170A are connected, and a rotation angle of the output module 190A is equal to a sum of the rotation angles of the first drive module 110 and the second drive module 180A. In Embodiment 2, a command to manipulate the first drive module 110 to rotate in a constant rotation velocity, as shown in FIG. 5A, is input into the first drive module 110. Meanwhile, a command to manipulate the second drive module 180A to rotate in a rotation angle, which modulates in a sine waveform, as shown in FIG. 5B, is input into the second drive module 180A. Thereby, rotation of the first drive module 110 and rotation of the second drive module 180A are combined by the differential gear 150A, and the output module 190A rotates in accordance with a waveform shown in FIG. 5C, in which the waveform in FIG. 5A is imposed over the waveform in FIG. 5B. According to the configuration of Embodiment 2, the rotation and the oscillation of the servomotors 11 are independently controlled easily. That is, rotary motion (center angle of oscillation) can be controlled by use of the first drive module 110, while the oscillation is controlled by the second drive module 180A independently from the rotary motion. In this regard, in Embodiment 2, an example, in which the first drive module 110 is driven at the constant-angled velocity and the second drive module 180A is oscillated in sine oscillation; however, the first drive module 110 and the second drive module 180A may be driven in different waveforms. For example, the first drive module may be driven in the constant-angled velocity, while the second drive module 180A may be driven in a ramp waveform. The configuration may be applied to control of a so-called rotation torsion tester, in which a specimen is rotated at a predetermined rate while torsion load (or an excitation force) is repeatedly applied to the specimen.

Embodiment 3

Figure 6A:
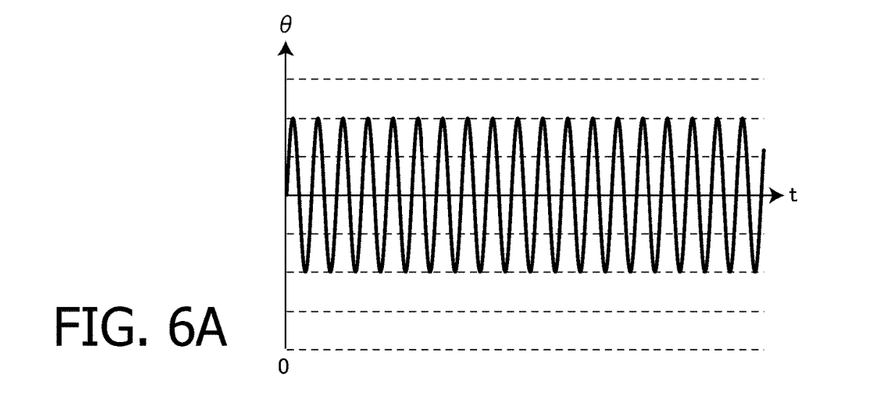
FIGS. 6A-6C are graphs to illustrate chronological changes of rotation angles of a first drive module, a second drive module, and an output module, respectively.
Figure 6B:
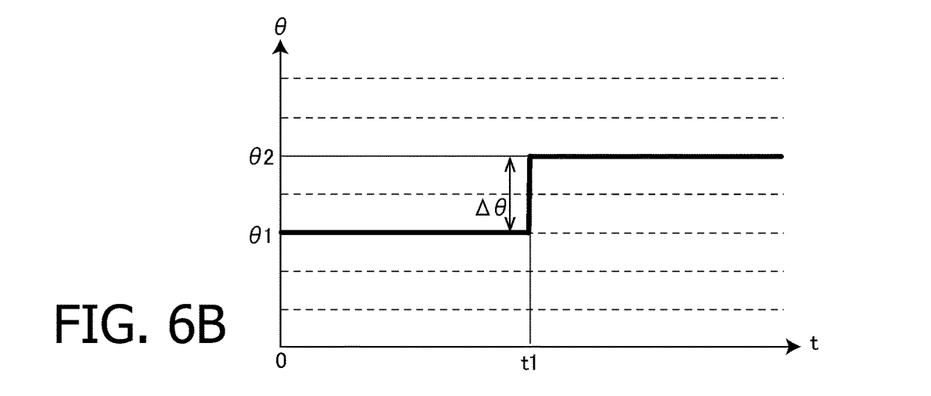
Figure 6C:
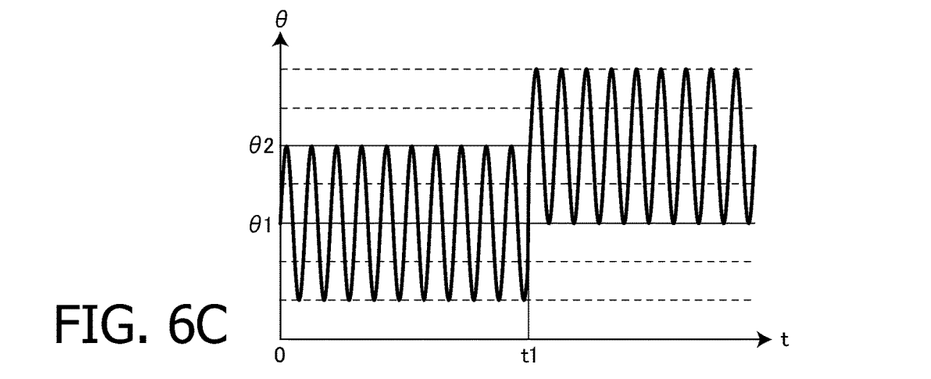

Next, Embodiment 3, in which the center angle of oscillation is controlled to be offset while the servomotor 11 is oscillated, will be described. Herein, an example to control the output module 190A will be described. FIGS. 6A, 6B, and 6C are graphs to illustrate chronological changes of rotation angles of the first drive module 110, the second drive module 180A, and the output module 190A, respectively. In Embodiment 3, again, the clutches 140A, 170A are connected, and the rotation angle of the output module 190A is equal to the sum of the rotation angles of the first drive module 110 and the second drive module 180A. In Embodiment 3, as shown in FIG. 6A, a command to modulate the rotation angle of the first drive module 110 according to the sine waveform is input into the first drive module 110. Further, as shown in FIG. 6B, the rotation angle of the second drive module 180 is set at a phase $\theta 1$ at the beginning of the control (t=0). During a period from 0 to t1, no driving pulse is supplied to the second drive module 180A so that the second drive module 180A is stopped at the rotation angle $\theta 1$. At a timing (t=t1), when the angle at the center of the oscillation of the servomotor 11 is offset, the driving pulse is input into the second drive module 180A, and the second drive module 180A is rotated for the rotation angle $\Delta\theta$. Thereafter, the driving pulse is not supplied to the second drive module 180A, and the second drive module 180A is stopped at a rotation angle $\theta 2$. As a result, driving is controlled so that the servomotor 11 associated with the output module 190A oscillates centering around the rotation angle $\theta 1$ during the period from 0 to t1 in the sine waveform; at the timing t1, the angle at the center of the oscillation is offset for the rotation angle $\Delta\theta$; and at the timing t1 and onward, the servomotor 11 oscillates centering around the rotation angle $\theta 2$ in the sine waveform. According to the configuration in Embodiment 3, the waveform of the oscillation of the servomotor 11 and the offset can be independently controlled easily. Namely, the driving waveform can be controlled by use of the first drive module 110 while the amount of offset can be controlled by the second drive module 180A independently from the control of the waveform. The oscillating waveform of the first drive module 110 may not necessarily be limited to the sine waveform, but various waveforms (e.g., sine wave, triangular wave, rectangular wave, ramp wave, and discretional composite wave) may be applied. Further, by driving the second drive module 180A arbitrarily, an offset amount, a direction of the offset, and/or a timing of the offset may be arbitrarily controlled. Furthermore, with a driving velocity of the second drive module 180A (a rate of the driving pulse) at the time of offsetting, moderateness or acuteness of the offset can be adjusted. The above description is an example to explain the control of the output module 190A; however, a plurality of output modules including the output module 190B may be synchronously driven while the phase $\theta$ of each output module is offset. In this regard, the phases of the output modules may be offset concurrently for a same amount, or the phase of each output module may be offset for a different amount at a different timing from one another.

Embodiment 4

Figure 7:
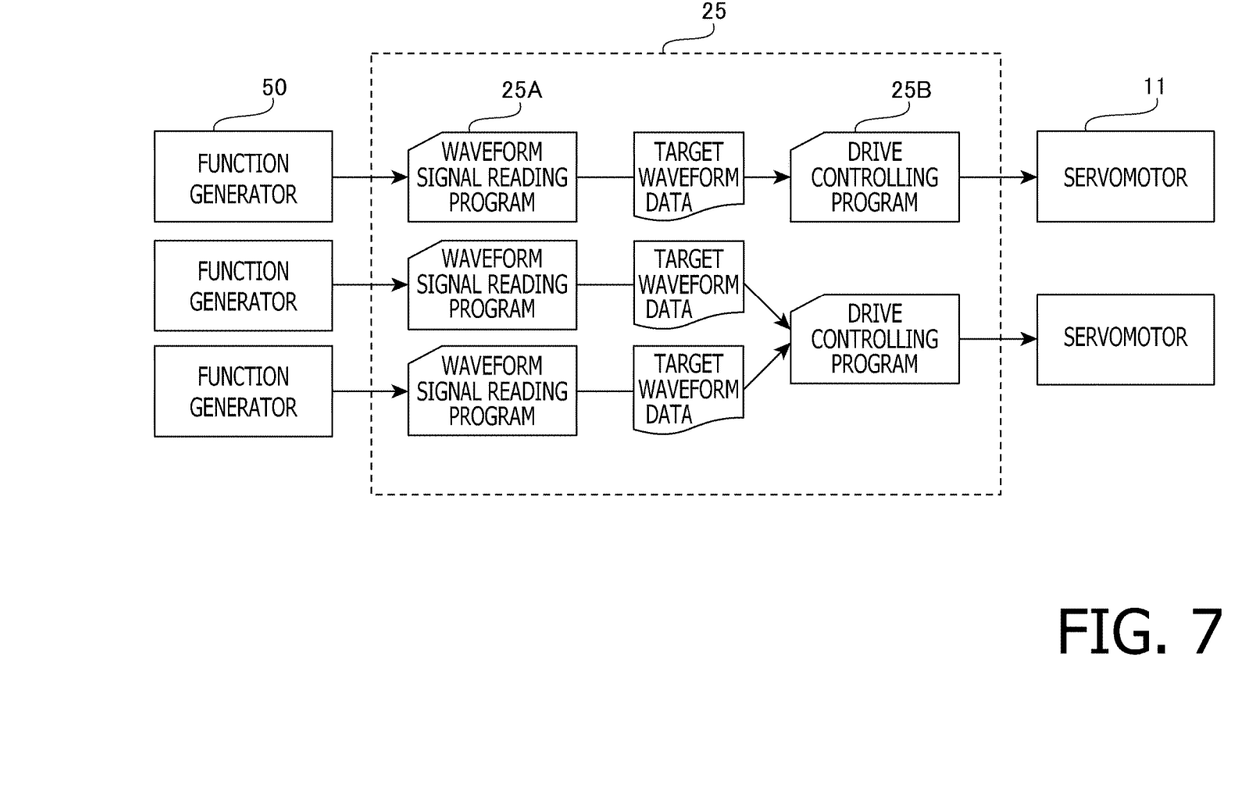
FIG. 7 is a block diagram to illustrate an overall configuration of a user program according to Embodiment 4.

Next, Embodiment 4, in which the servomotors 11 are controlled based on alternating current voltage signals (analog waveform signals) generated by the function generator 50, will be described. FIG. 7 is a block diagram to illustrate an overall configuration of the user program 20c according to Embodiment 4. The SFC user program 25 used in Embodiment 4 is configured with two kinds of programs (a waveform signal reading program 25A and a drive controlling program 25B), which are executed concurrently in parallel with one another. The waveform signal reading program 25A executes a process to convert analog waveform signals, which are input into an analog signal input unit (not shown) in the motion controller 20, into target waveform data sequentially. Meanwhile, the drive controlling program 25B executes a process to drive the servomotor 11 based on the target waveform data generated by the waveform signal reading program 25A. The waveform signal reading program 25A is provided to each one of a number of analog waveform signals to be used to control the mechanical testing device 1 and is run in parallel with each other. Meanwhile, the drive controlling program 25B is provided to each one of a number of the servomotors 11 in the mechanical testing device 1 and is run in parallel with each other. In this regard, within the servomotors 11 which are to be controlled uniformly, a common drive controlling program 25B is shared. Thus, by running the plurality of waveform signal reading programs 25A and/or the plurality of drive controlling programs 25B in parallel with one another, complex driving control over the plurality of servomotors 11 by use of the plurality of analog waveform signals is enabled. Embodiment 4 is an example to control driving of the plurality of servomotors 11 by use of the SFC user program 25 alone without using the mechanical system user program 26; however, for another example, the mechanical system user program 26 may be called by the drive controlling program 25B to control another servomotor 11 synchronously.

Embodiment 5

Figure 8:
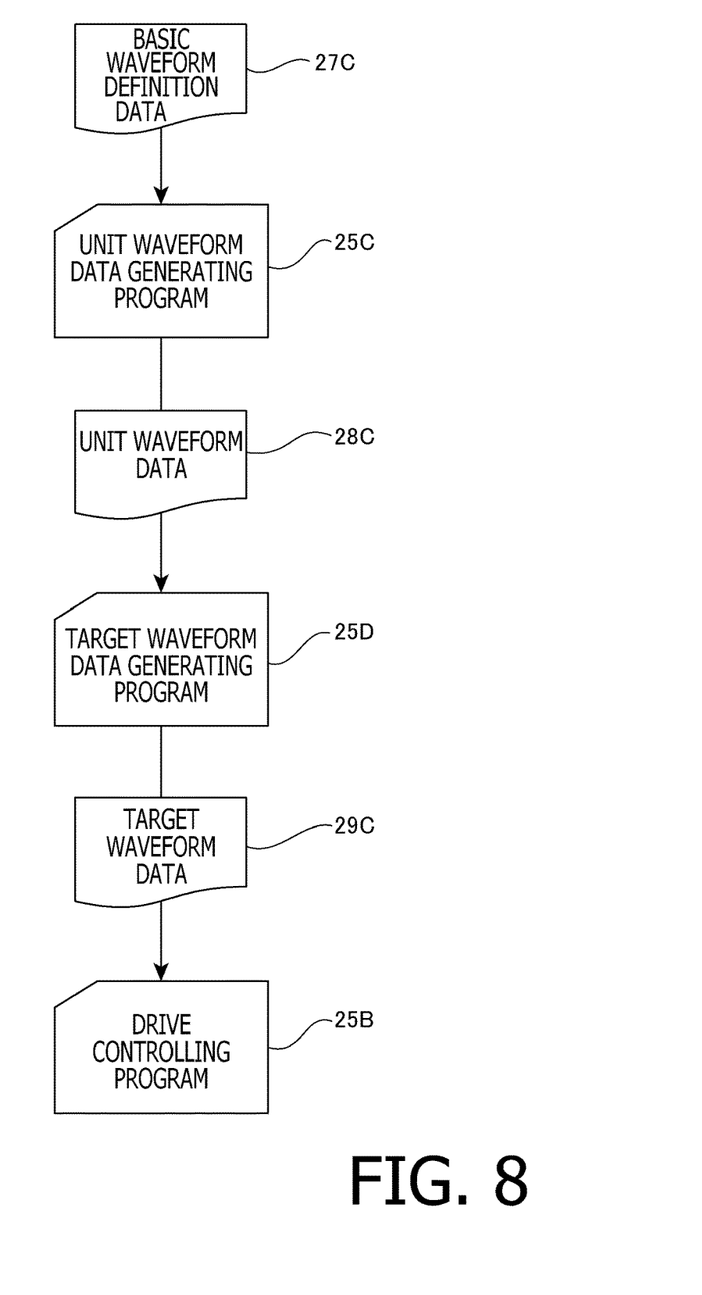
FIG. 8 is a diagram to illustrate a configuration of a user program to be used to control according to Embodiment 5.

Next, Embodiment 5 to control behaviors of the mechanical testing device 1 by use of basic waveform definition data 27C, which will be described later, stored in advance in the motion controller 20 will be described. FIG. 8 is a diagram to illustrate a configuration of the user program 20c to be used for the control in Embodiment 5. As show in FIG. 8, in Embodiment 5, the behaviors of the mechanical testing device 1 are controlled by use of the basic waveform definition data 27C, which is a part of the user setting data 27, and three parts of the SFC user program 25 (a unit waveform data generating program 25C, a target waveform data generating program 25D, and the drive controlling program 25B).

Figure 9:
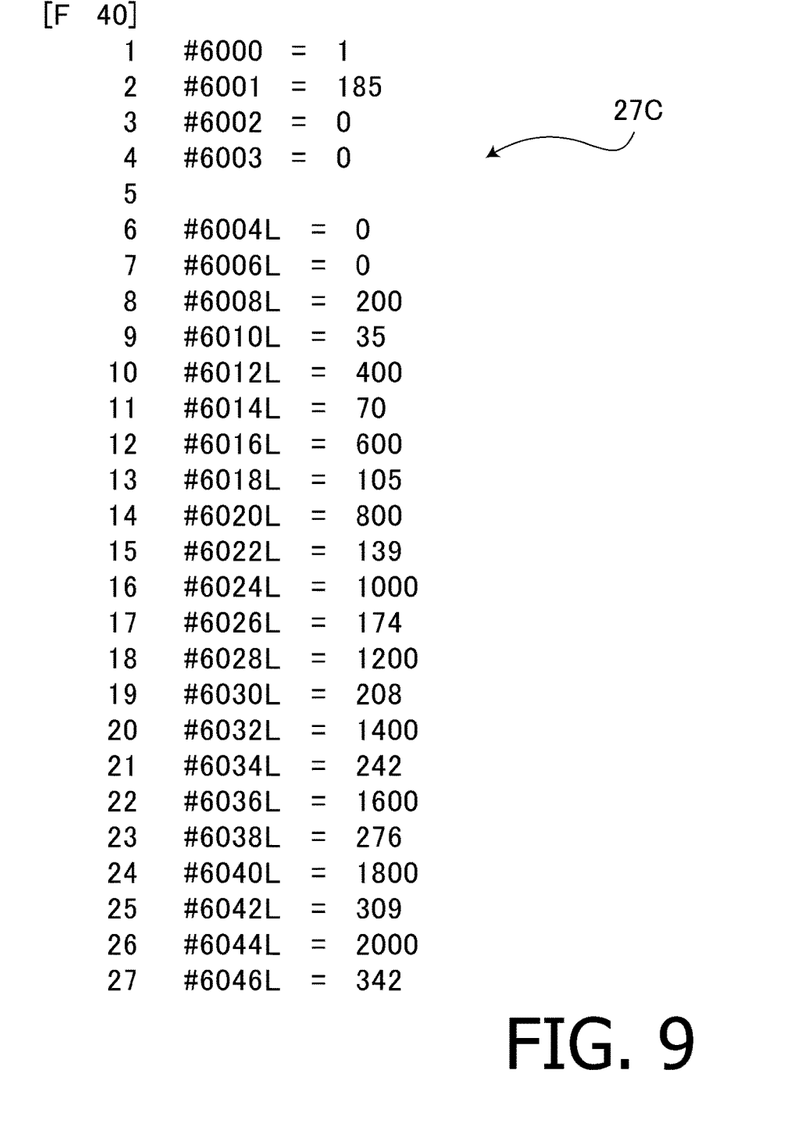
FIG. 9 is a diagram to illustrate an example of basic waveform definition data 27C.

An example of the basic waveform definition data 27C is shown in FIG. 9. The basic waveform definition data 27C is matrix data, which describes a cycle of basic waveform in accordance with predetermined codes. In a memory (not shown) in the motion controller 20, stored is basic waveform definition data 27C, which is associated with a plurality of kinds of basic waveforms (e.g., sine wave, triangular wave, rectangular wave, ramp wave, and discretional composite wave). Optionally, the basic waveform definition data 27C may be prepared by a user by use of dedicated application software installed in the PC 40. The basic waveform definition data 27C is, unlike the unit waveform data 28C described later, data containing legitimate oscillation and periodicity. The unit waveform data generating program 25C reads the basic waveform definition data 27C associated with the waveform to be used to control the mechanical testing device 1 and, based on the basic waveform definition data 27C, generates one cycle of the unit waveform data 28C, which is waveform data containing the specified oscillation and periodicity. The unit waveform data 28C is configured with paired data units for time t and a rotation angle θ and contains a plurality of pairs of the data units generated at a predetermined time interval. Optionally, in place of the oscillation, intensity of the unit waveform data C to be generated may be specified by a maximum value/a minimum value or a center value/a half amplitude value. The target waveform data generating program 25D generates target waveform data 29C being continuous waveform data by use of one or more items of unit waveform data 28C. The drive controlling program 25B reads the paired data units in the target waveform data 29C sequentially at the interval according to the cycle in the specified waveform and outputs the oscillation of the target waveform data 29C to the servo amplifiers 11a as a command signal C in synchronization with an internal clock (when synchronously controlled, through the mechanical system user program 26). In the present embodiment, the unit waveform data generating program 25C and the target waveform data generating program 25D are provided; however, these programs may be integrated, and the target waveform data 29C may be directly generated from the basic waveform definition data 27C.

Embodiment 6

Figure 10A:
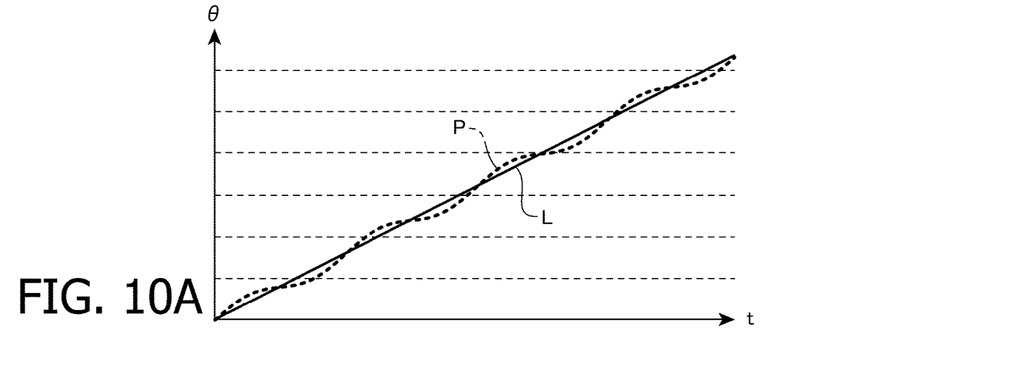
FIGS. 10A-10C are graphs to illustrate correction of controlling amounts according to Embodiment 6.
Figure 10B:
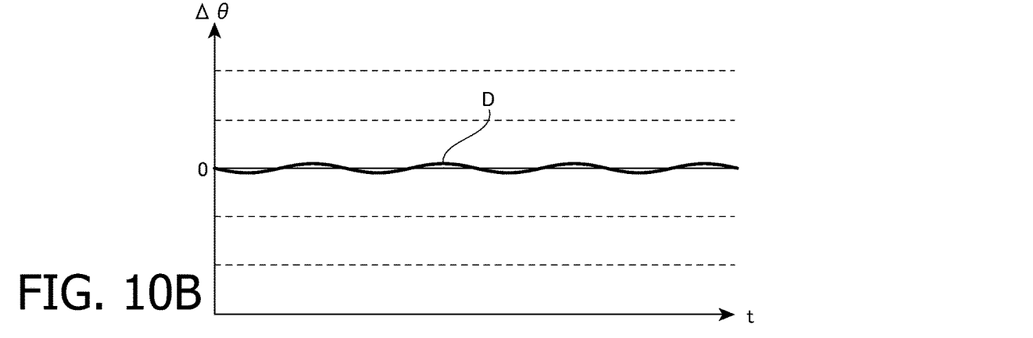
Figure 10C:
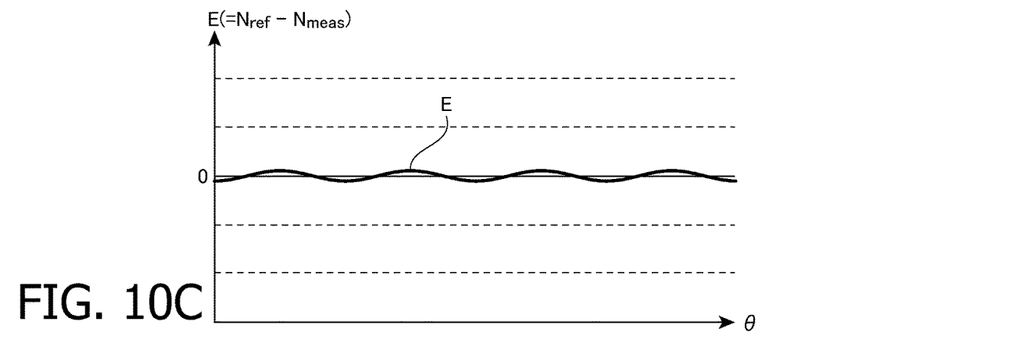
Figure 11:
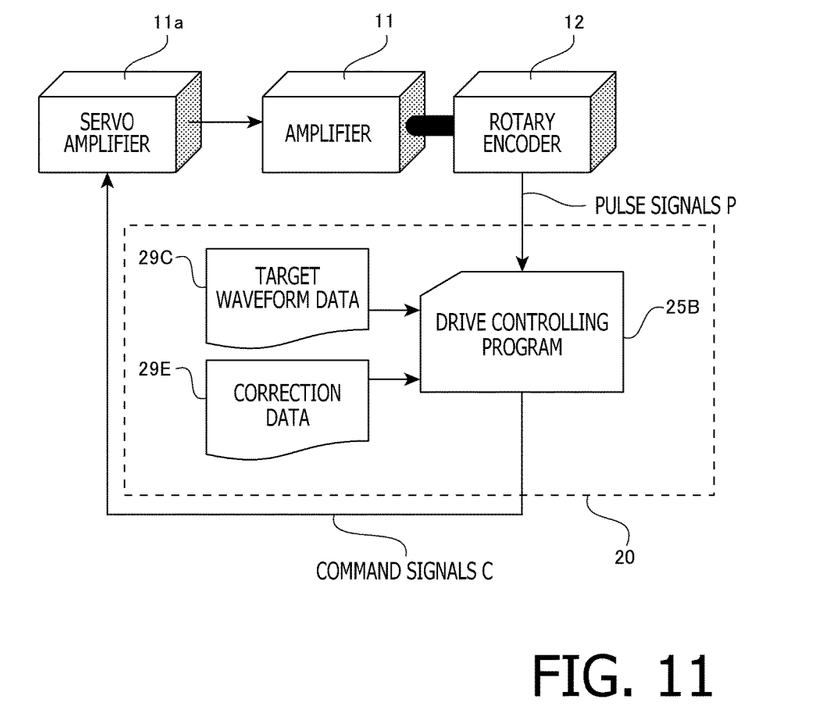
FIG. 11 is a block diagram to illustrate an overall configuration of a control system according to Embodiment 6.

Next, Embodiment 6 will be described. FIG. 11 is a block diagram to illustrate an overall configuration of control in Embodiment 6. Meanwhile, FIGS. 10A-10C show graphs to illustrate correction of controlling amounts (rotation amounts) in Embodiment 6. Embodiment 6 is an example of controlling a rotation rate (velocity control), whereas a rotating amount N (a phase velocity ω=2πN) of a rotation shaft of the servomotor 11 is the controlled amount, and the control is performed when the motion controller 20 is in a rotation amount controlling mode. The servomotors 11 are, under influence of factors such as cogging torque, even if driven at constant output, torque ripples, in which output torque fluctuates within one round of rotation, are produced. Further, in the same reason, even if the rotation rate is controlled, velocity ripples, in which the phase velocity ω fluctuates depending on the phase θ, are produced. According to Embodiment 6, by correcting a target value of the phase velocity ω according to the phase θ of the servomotor 11, the velocity ripples are resolved, and steady rotating motion is achieved.

In Embodiment 6, fluctuation of a rotating amount N within a rotation period, when the servomotor 11 is rotated at a constant velocity, is measured in advance. In particular, first, when the servomotor 11 is rotated at a constant velocity, timings (time t) when pulses are output from the rotary encoder 12 are timed. While the phase θ of the servomotor 11 at the timing t, at which each pulse is output, is known, plotting each pulse (time t and phase θ) provides a graph indicating chronological change of the phase θ as indicated by a plot P shown in FIG. 10A. The up-and-down oscillation of the plot P indicates presence of periodical fluctuation (velocity ripples) of the rotating amount N. Meanwhile, a line L shown in FIG. 10A indicates the plot P approximated linearly by a least square method. While influence of the velocity ripples, which appear as a form of the periodical fluctuation, is canceled in the linear approximation, the line L can be regarded as the chronological change (i.e., a waveform of target values) of the phase θ in an ideal condition, wherein no velocity ripple is produced.

A curve D shown in FIG. 10B is a graph indicating a difference $\theta_L - \theta_P$ between a curve P (a fitting curve of the plot P) and the line L. The difference is caused by the velocity ripples of the servomotor 11. Therefore, by differentiating the curve D by time, the velocity ripples, that is, the deviation E ($N_{ref} - N_{meas}$) of the rotating amount N (ω=2πN) of the servomotor 11, is achieved (note that $N_{ref}$ represents the target value of the rotating amount N, and $N_{meas}$ represents the measured value of the rotating amount N). A curve E shown in FIG. 10C indicates the curve D differentiated by time with the horizontal axis being converted into the phase.

The deviation E may be used as a correction value for the rotating amount N. Namely, the rotational phase θ of the servomotor 11 may be controlled by use of the correction value, which is corrected by adding a value in the curve E to a target value $N_{set}$ for the rotating amount so that the torque ripples are compensated, and the rotating amount is steadily controlled. In this regard, the waveform of the curve E achieved in advance has been recorded in an internal memory of the motion controller 20 to serve as a lookup table (correction data 29E).

Next, a method to control driving of the servomotor 11 by use of the correction data E will be described. FIG. 11 is a block diagram to illustrate an overall configuration of a controlling system according to Embodiment 6. As shown in FIG. 11, first, pulse signals P from the rotary encoder 12 are input into the motion controller 20 (drive controlling program 25B). The drive controlling program 25B computes the phase θ of the servomotor 11 based on the pulse signals P and obtains the correction value E corresponding to the phase θ with reference to the correction data 29E. Further, the drive controlling program 25B reads the target waveform data 29C generated by the above-mentioned target waveform data generating program 25D and outputs the target value $N_{ref}$ of the rotating amount with the correction value E added thereto to the servo amplifier 11a as a command signal C. The servo amplifier 11a generates a driving current according to the command signal C and drives the servomotor 11. Meanwhile, the rotary encoder 12 outputs the pulse signal P to the motion controller 20 so that the pulse signal P are input again into the running drive controlling program 25B.

The torque ripples and the velocity ripples serve in the functions for the phase θ of the servomotor 11; however, even when the velocity is controlled to maintain the rotating amount N constant, the phase θ of the servomotor 11 may not necessarily be in synchronization with an internal clock of the motion controller 20. Therefore, in Embodiment 6, by controlling the servomotor 11 in synchronization with the output from the rotary encoder in the servomotor 11, effective correction of the torque ripples and the velocity ripples is achieved.

While Embodiment 6 described above is an example of velocity control (rotation amount control), the present invention is not limited to the configuration described in Embodiment 6, but may be applied to other controlling modes such as, for example, phase control, in which the phase θ is used as a controlled amount to be controlled, and torque control, in which the torque is used as the controlled amount to be controlled. Meanwhile, as to the correction amount E, deviation of the controlled amount is used.

While, in Embodiment 6 described above, the waveform of the correction data 29E is experimentally obtained, the torque ripples and the velocity ripples are generally preferably approximated by cosine of the phase θ of the servomotor 11. Therefore, the waveform of the cosine suited to the oscillation, cycles, and phases of the torque ripples and the velocity ripples may be used as the correction data 29E.

The foregoing is the exemplary embodiments of the present invention. The configuration of embodiment of the invention is not limited to those explained above, but may be arbitrarily modified within a scope of the technical concept expressed in the claims.

For example, the embodiments described above are concerning control of the rotation angle of the rotation shaft in the servomotor 11; however, configurations of the present invention may not necessarily be limited to those described above, but may include a configuration, in which a rotating amount, torque, or a position, velocity, driving force of an actuator driven by the servomotor, or the like, is controlled to be the target value.

In the embodiments described above, the motion controller 20 provides the command signals to the servo amplifier 11a in digital; however, command signals in another format (e.g., analog current signals, analog voltage signals, and pulse signals) may be provided to the servo amplifier 11a.

Further, the configurations in the embodiments described above may be applied to various mechanical testing devices such as a tension/compression testing device, a torsion testing device, a vibration testing device, etc.

What is claimed is:

1. A computer readable non-transitory medium having a control program recorded thereon for execution on a computer to simulate behaviors of a virtual mechanical mechanism and to control synchronized driving of a plurality of servomotors based on results of the simulation to test a specimen, the control program causing the computer to execute operations comprising:
   simulating the behaviors of the virtual mechanical mechanism; and
   controlling driving of the plurality of servomotors based on the results of the simulation,
   wherein the virtual mechanical mechanism simulated by the computer comprises:
      a first drive module driven according to a first driving waveform;
      a first main shaft module connected to and driven by the first drive module; and
      a plurality of power transmission subsystems, respective power transmission subsystems being connected to the first main shaft module and associated with one of the plurality of servomotors, the respective power transmission subsystems comprising:
         an output module:
         a second drive module; and
         a differential gear module comprising:
            a main input shaft connected with the first main shaft module;
            an auxiliary input shaft connectable with the second drive module via a clutch module; and
            an output shaft connected with an input of the output module, the output module being associated with a respective servomotor,
   wherein simulating the behaviors of the virtual mechanical mechanism comprises:
      rotating the output shaft of the respective power transmission subsystems at the same rotational speed as a rotational speed of the main input shaft-when the auxiliary input shaft is disconnected from the second drive module, and
      rotating the output shaft at a rotational speed difference between a rotational speed of the main input shaft and a rotational speed of the auxiliary input shaft when the auxiliary input shaft is connected to the second drive module and the auxiliary input shaft is driven by the second drive module,
   wherein controlling driving of the plurality of servomotors comprises driving the servomotor associated with the output module according to a simulated result of the input of the output module to rotate a rotation axis of the respective servomotor at the same phase of the output module associated with the respective servomotor.

2. The control program according to claim 1, wherein the main input shaft is connected with the first main shaft module via a first clutch module.

3. The control program according to claim 1, wherein a phase of driving the servomotor is controlled by setting a rotational position of the second drive module.

4. The control program according to claim 1, wherein the second drive module is driven according to an oscillatory waveform, and rotation of the servomotor is oscillated according to the oscillatory waveform centering around a rotational position of the servomotor defined by the first driving waveform.

5. The control program according to claim 4, wherein the first driving waveform is a ramp wave, and a center of rotary oscillation of the servomotor moves at a constant-angled velocity.

6. The control program according to claim 1, wherein a driving waveform of the servomotor is offset by driving the second drive module in a stepwise pattern according to a rectangular wave.

7. A control method to manipulate a computer to simulate behaviors of a virtual mechanical mechanism and to control synchronized driving of a plurality of servomotors based on results of the simulation, the control method including causing the computer to execute operations comprising:
   simulating the behaviors of the virtual mechanical mechanism; and
   controlling driving of the plurality of servomotors based on the results of the simulation,
   wherein the virtual mechanical mechanism simulated by the computer comprises:
      a first drive module driven according to a first driving waveform;
      a first main shaft module connected to and driven by the first drive module; and a plurality of power transmission subsystems, respective power transmission subsystems being connected to the first main shaft module and associated with one of the plurality of servomotors, the respective power transmission subsystems comprising:
an output module;
a second drive module; and
a differential gear module comprising:
a main input shaft connected with the first main shaft module;
an auxiliary input shaft connectable with the second drive module via a clutch module; and
an output shaft connected with an input of the output module, the output module being associated with a respective servomotor,
wherein simulating the behaviors of the virtual mechanical mechanism comprises:
rotating the output shaft of the respective power transmission subsystems at the same rotational speed as a rotational speed of the main input shaft when the auxiliary input shaft is disconnected from the second drive module, and
rotating the output shaft at a rotational speed difference between a rotational speed of the main input shaft and a rotational speed of the auxiliary input shaft when the auxiliary input shaft is connected to the second drive module and the auxiliary input shaft is driven by the second drive module,
wherein controlling driving of the plurality of servomotors comprises driving the respective servomotor associated with the output module according to a simulated result of the input of the output module to rotate a rotational axis of the respective servomotor at the same phase of the output shaft module associated with the respective servomotor.

8. A control device to control a plurality of servomotors comprising:
a computer;
a simulation unit executed by the computer, configured to simulate behaviors of a virtual mechanical mechanism; and a drive control unit executed by the computer, configured to control driving of the plurality of servomotors based on the results of the simulation,
wherein the virtual mechanical mechanism comprises:
a first drive module driven according to a first driving waveform;
a first main shaft module connected to and driven by the first drive module; and
a plurality of power transmission subsystems, respective power transmission subsystems being connected to the first main shaft module and associated with one of the plurality of servomotors, the respective power transmission subsystems comprising:
an output module;
a second drive module; and
a differential gear module comprising:
a main input shaft connected with the first main shaft module;
an auxiliary input shaft connectable with the second drive module via a clutch module; and
an output shaft connected with an input of the output module, the output module being associated with a respective servomotor, wherein
the output shaft of the respective power transmission subsystems is rotated at the same rotational speed of the main input shaft when the auxiliary input shaft is disconnected from the second drive module, and
the output shaft is rotated at a rotational speed difference between a rotational speed of the main input shaft and a rotational speed of the auxiliary input shaft when the auxiliary input shaft is connected to the second drive module and the auxiliary input shaft is driven by the second drive module, and
the drive control unit outputs a control signal to control driving of the servomotor associated with the output module according to a simulated result of the input of the output module to rotate a rotation axis of the respective servomotor at the same phase of the output module associated with the respective servomotor.

* * * * *